United States Patent [19]

Murphy et al.

[11] Patent Number: 4,945,032
[45] Date of Patent: Jul. 31, 1990

[54] STEREOLITHOGRAPHY USING REPEATED EXPOSURES TO INCREASE STRENGTH AND REDUCE DISTORTION

[75] Inventors: Edward J. Murphy, Des Plaines; Robert E. Ansel, Hoffman Estates; John J. Krajewski, Wheeling, all of Ill.

[73] Assignee: DeSoto, Inc., Des Plaines, Ill.

[21] Appl. No.: 429,561

[22] Filed: Oct. 31, 1989

Related U.S. Application Data

[63] Continuation-in-part of Ser. No. 176,240, Mar. 31, 1988, abandoned.

[51] Int. Cl.$^5$ .................. B29B 13/08; B29C 35/08
[52] U.S. Cl. .................. 430/394; 430/269; 430/322; 430/945; 365/120; 425/174; 425/174.4; 427/53.1; 427/54.1; 264/1.4; 264/22
[58] Field of Search .................. 264/1.1, 1.4, 1.6, 1.7, 264/2.2, 22, 24, 183, 40.1; 365/119, 120; 425/174, 14.8, 23, 162, 425; 430/321, 327, 329, 394; 427/54.1, 53.1; 42/269, 945, 322, 325, 328

[56] References Cited

U.S. PATENT DOCUMENTS

| | | | |
|---|---|---|---|
| 4,575,330 | 3/1986 | Hull | 425/174.4 |
| 4,751,170 | 6/1988 | Mimura et al. | 430/296 |
| 4,752,498 | 6/1988 | Fudim | 422/54.1 |

FOREIGN PATENT DOCUMENTS

62-101408  5/1987  Japan.

*Primary Examiner*—Ellis P. Robinson
*Assistant Examiner*—Donald J. Loney
*Attorney, Agent, or Firm*—Dressler, Goldsmith, Shore, Sutker & Milnamow

[57] ABSTRACT

An improved stereolithographic process is provided in which the formation of a thin walled three-dimensional object in a reservoir of liquid ultraviolet-curable ethylenically unsaturated material using a support is positioned immediately beneath the upper surface of the liquid reservoir with that upper surface being exposed to ultraviolet light in a pattern to solidify the liquid at and near the upper surface in a series of cross-sections of the desired three-dimensional object, one atop the other. In this way there is formed a series of superposed layers which adhere to one another to build the desired three-dimensional object within the liquid reservoir. The improvement comprises, stopping the exposure at any portion of the surface in the formation of said layers and then repeating the exposure at least once again in the production of each surface layer so that the strength and solvent resistance of the formed object are increased and its distortion is minimized. The ultraviolet exposure of each surface layer is preferably carried out as a series of rapid repeated scans of a computer-directed focused laser.

6 Claims, No Drawings

STEREOLITHOGRAPHY USING REPEATED EXPOSURES TO INCREASE STRENGTH AND REDUCE DISTORTION

DESCRIPTION

1. Cross-Reference to Related Application

This application is a Continuation-in-Part of U.S. Application Ser. No. 176,240 filed March 31, 1988, now abandoned.

2. Technical Field

This invention relates to the production of stereolithographically formed elements which are complexly-shaped thin-walled polymeric objects and which are incompletely cured as a result of having been produced by an exposure to ultraviolet light which is merely adequate to solidify the desired layer of liquid photocurable composition which is used.

3. Background Art

It is known, as illustrated in U.S. Pat. No. 4,575,330 to C. W. Hull, to form three-dimensional objects of complex shape using ultraviolet light to solidify superposed layers of liquid ultraviolet-curable ethylenically unsaturated material at the surface of a reservoir of such material. Thin walled objects are formed in this manner, apparently thick walls being hollow and dimensionally stabilized by thin internal webs. The ultraviolet dosage is limited to insure that only thin layers near those portions of the surface of the unsaturated liquid struck by the beam of ultraviolet light will be solidified. It is intended to maximize the accuracy of the stereolithographically formed elements using a process which minimizes the inherent distortion in the solidified superposed layers which form the desired object.

As will be evident, the thin walled object formed in the liquid reservoir is incompletely cured and has inadequate strength and dimensional integrity. Of particular significance is the fact that these stereolithographic processes are intended to form three dimensional models which conform as accurately as possible with what was intended, this usually being set forth in drawings which are cross-sectioned by computer to guide a laser beam in the production of the superposed layers. These incompletely cured products tend to become somewhat distorted during the process of photoformation. This distortion is due to a volume shrinkage of the liquid ultraviolet-curable material during photopolymerization, and the inadequate strength of the incompletely cured three-dimensional objects to resist the stresses which flow out of that volume shrinkage.

It is desired to provide relatively low viscosity flowable liquid compositions which cure rapidly on ultraviolet exposure and which exhibit increased strength and decreased distortion when solidified by the stereolithographic process under consideration. On the other hand, the greater the proportion of acrylate-functional material in the liquid vat composition, the more rapid the cure, but the greater the distortion due to increased volume shrinkage.

It is desired to point out that the rate at which the ultraviolet laser is moved over the surface of the liquid reservoir which is exposed can vary. At the present time, the laser is moved at a rate which will provide a dosage which is high enough to provide the desired partial cure, but not at a slower rate because that increases the depth of the layer which is cured without greatly increasing the extent of cure within the layer which it is desired to cure. The slower the laser moves, the greater the dosage and the thicker the layer which is formed. The thicker the layer which is solidified by the ultraviolet exposure, the less the dimensional accuracy of the stereolithographic process.

More particularly, in the conventional stereolithographic process, a support is positioned beneath the surface of a liquid reservoir of photopolymerizable material to hold the polymerized layer which is formed by exposure. The liquid level is then raised (or the support lowered) to cause a fresh layer of polymerizable liquid to flow over the previously solidified layer. Another layer is then formed by ultraviolet exposure atop the first until the photoformed object is completed within the liquid reservoir.

The photoformed objects are thus only partially cured and are somewhat gelatinous and mechanically weak due to the low degree of crosslinking and the presence of unconverted monomers and oligomers (which are still unsaturated) within the partially polymerized polymeric structure of the solid object which is formed. It is known that increased ultraviolet dosage applied in the form of a slower laser draw speed does increase mechanical strength somewhat, but this is unsatisfactory, as previously noted.

Moreover, when many layers are sequentially exposed and solidified, one above the other, the subsequent exposures cause the layers previously formed to be distorted because of the shrinkage during photoformation of the uppermost layer which is adherent to the layer beneath itself. It is desired to increase the strength of the photoformed object without decreasing the accuracy of the process and while minimizing the distortion of the object which is withdrawn from the photopolymerizable bath. It is the minimization of the distortion in the incompletely cured object which is withdrawn from the reservoir which is the object of this invention.

DISCLOSURE OF INVENTION

In accordance with this invention, as in the Hull patent referred to previously, a method is provided for the formation of a thin walled three-dimensional object in a reservoir of liquid ultraviolet-curable ethylenically unsaturated material which preferably comprises acrylate-functional material to speed the ultraviolet-initiated cure.

In this method, a support is positioned immediately beneath the upper surface of the liquid reservoir, and this upper surface is exposed in a pattern (usually by means of the computer-directed scanning of an ultraviolet laser light source) to solidify the liquid at and near its upper surface in a series of cross-sections of the three-dimensional object which it is desired to form, one atop the other. In this way there is provided a series of superposed solidified layers which adhere to one another to build a three-dimensional object within the liquid reservoir. As disclosed in the Hull Patent a surface other than the upper surface can be exposed.

In this invention, the ultraviolet exposure applied at any portion of the surface is stopped and then repeated at least once again in the production of each surface layer so that the strength and solvent resistance of the formed object are increased and its distortion is minimized. In preferred practice this procedure is carried out as a series of repeated, rapid scans of the ultraviolet-curable liquid surface by the computer-directed laser light source in the production of each surface layer. As a result, the surface layers formed herein are stronger and less distorted, and this is accomplished with minimal increase in the thickness of the layers which are solidified by the repeated, rapid exposures.

The liquid ultraviolet-curable ethylenically unsaturated materials which are used in this invention may be broadly constituted by any such material or combination of materials, albeit it is desired to minimize the proportion of non-polymerizable volatile material (volatile organic solvents) which is present. One objective is to provide a liquid of minimum viscosity so that it will flow easily to provide a fresh layer of liquid atop the previously solidified layer. A second objective is to provide an ultraviolet initiated cure which is as rapid as possible.

In line with these objectives, the liquid which is used to constitute the reservoir of liquid in which the three-dimensional object is formed preferably comprises at least one acrylate-functional material since acrylates are the most rapid curing of the ethylenically unsaturated compounds and oligomers which are available. Unfortunately, these acrylates, while rapid curing, shrink considerably during photoformation. Also, when solidified in the normal stereolithographic process under consideration, they form gelatinous solids of relatively little strength and dimensional stability. These difficulties are increased as the viscosity is decreased.

More particularly, the solids which are formed in the normal stereolithographic practice of a slow, single scan of the liquid surface are extensively extracted by immersion in organic solvents, such as methyl ethyl ketone, they have little strength, and they shrink further when irradiated by the low levels of ultraviolet exposure to which they are subjected as the superposed layers are solidified over them. As a result, distortion is extensive, and this is manifestly inconsistent with obtaining the accurately dimensioned models which are the primary contemplation of the Hull process.

A simple test of dimensional accuracy is employed herein and is described as follows.

A line exposure is made and repeated to solidify layer after layer and thus build a thin rectangle on the support which possesses another cantilevered rectangular structure. An effort is made to form a cantilevered rectangle which is 0.25 inch by 0.25 inch by 15 mils in thickness. When this thin cantilevered rectangle is completed and withdrawn from the bath, one measures the top and the bottom of the cantilevered rectangle and divides the length of the top by the length of the bottom. It is found that the distortions caused by the normal stereolithographic process have produced a shrinkage of the bottom (formed by the first layer which is solidified) which causes it to be smaller than the top (formed by the last layer which is solidified). This ratio of top length to bottom length provides what is referred to as a distortion factor. As should be evident, a perfect rectangle will provide a ratio of 1.0, but in practice these ratios are considerably higher than 1.0, and the larger the number, the greater the distortion.

In general it is found that the larger the proportion of acrylate functionality in the liquid reservoir composition, the faster the cure speed on ultraviolet exposure and the greater the distortion. A prime purpose of this invention is to maximize the cure speed while minimizing the distortion.

It is known that the longer the exposure to a given source of radiation, the thicker the layer which is solidified. This action continues until the radiation reaching the lowest level falls below a minimum value. When a given layer being solidified extends beyond the edge of the layer supporting it, which happens frequently when forming complex parts, the incident radiation extends below the bottom of the supporting layer. This is undesirable because it forms solid material where none is wanted. The intensity of the radiation exposure must be limited to minimize this, and as a result the radiation exposure in the surface layer of desired thickness is ample to convert the liquid to a solid, but it is inadequate to provide a solid with adequate strength and resistance to distortion.

Accordingly, one cannot merely employ a greater exposure, either by increasing its time or intensity.

While it is not desired to be bound by any theory of action, it is thought that ultraviolet exposure causes the photoinitiator to form free radicals which cause polymerization when they are correctly positioned with respect to nearby unsaturated groups. The photoinitiator present absorbs less incident radiation in its free radical form and only some of these free radicals form polymers during the first exposure. As a result, a more extended or stronger exposure largely extends more deeply into the liquid to thicken the layer which is solidified. The efficiency of polymerization as a function of incident ultraviolet energy is thus reduced in the layer of intended thickness. But when the first ultraviolet exposure is terminated, the free radicals recombine and migrate to new locations. Repeated short exposures, e.g., a second short exposure, are now absorbed closer to the surface and the free radicals are better positioned to cause polymerization. As a result, short repeated exposures are significantly more efficient than a single longer exposure in the stereolithographic process.

In addition to the improvement in polymerization efficiency with short repeated exposures, there is also an improvement in the mechanical behavior of the photoformed structures. The amount of distortion in a three-dimensional stereolithographically formed object will be related directly to the shrinkage-induced stress and inversely related to the resistive modulus of the polymeric structure. In the partially converted gelled polymeric structures of the present invention, the incremental advancement in the degree of conversion caused by repeated short laser exposure results in a larger relative increase in the resistive modulus than in the shrinkage induced stress. So the application of short repeated exposures allows for the incremental advancement of the polymerization so as to assure the minimum of distortion in stereolithographically formed objects.

It is noted in passing that the exposure of the liquid is frequently in the form of a spot of light in or near the ultraviolet range, i.e., light having a wavelength of about 200 to about 550, preferably about 250 to about 450, nanometers (nm). The term "near" as used in the phrase "near the ultraviolet range", refers to light at the lower end of the visible light spectrum. This light is preferably provided by an ultraviolet laser which is focused on a spot of minimal size. The ultraviolet source we used is supplied by a helium-cadmium laser which emits light having a wavelength of 325 nanometers, and this light is supplied with an output energy of 10 milliwatts onto a focused spot having a diameter of 350 microns. The radiant power supplied to this spot can therefore be identified as the number of watts supplied per square centimeter, and in this instance 10.4 watts/cm$^2$ are supplied to the spot.

This spot of light is then moved across the surface of the liquid reservoir at a given speed, and this completes the identification of the dosage which is supplied. The velocity is identified by the number of seconds (or fraction of a second) required for the light to move one centimeter. The result is reported in seconds per centimeter, and this discussion should make these somewhat unusual units understandable.

To more fully illustrate the ethylenically unsaturated liquid reservoir compositions which may be used, these normally comprise a viscous liquid to solid resinous material which is usually described to be an oligomer or a low molecular weight resin. These preferably carry a plurality (more than one) of polymerizable ethylenically unsaturated groups. These resins are used in combination with an ethylenically unsaturated low viscosity liquid which serves as a reactive solvent to reduce the viscosity so that the reservoir composition is an easily flowable liquid at its use temperature (which is normally about room temperature)

The polyethylenically unsaturated resinous materials are usually polyacrylates or polymethacrylates, and the low viscosity liquid which provides the needed liquidity is usually a monoacrylate or monomethacrylate or a low molecular weight polyacrylate or polymethacrylate. As previously indicated, acrylate functionality is desired to obtain the most rapid cure.

Other liquid monomers having approximately the same reactivity as the acrylate liquids are regarded herein as acrylate-functional because they respond in the same way under normal stereolithographic single scan exposure to provide the rapid cure on ultraviolet exposure and the same problem of inadequate strength when exposed sufficient to provide solidity. These rapid-curing monomers which act in the same way as acrylate-functional liquids are N-vinyl monomers which are preferably illustrated by N-vinyl pyrrolidone and N-vinyl caprolactam. The polyacrylate or polymethacrylate liquids, and the like, are preferably illustrated by trimethylol propane trimethacrylate and pentaerythritol trimethacrylate, or the corresponding triacrylates.

The resinous polyacrylate or polymethacrylate which provide a polymeric matrix enabling the ultimately fully cured solid object to have its structural strength is subject to considerable variation so long as it is of resinous nature and preferably contains an average of at least 2.0 acrylate or methacrylate groups per molecule. These can be illustrated by epoxy diacrylates, such as Epon 1001 diacrylate or Epon 828 diacrylate, or one can use polyester or polyether diacrylates. The corresponding methacrylates are also useful, but less preferred.

From about 1% to about 10% of a photoinitiator effective on ultraviolet exposure to initiate the polymerization of acrylate unsaturation is included in the reservoir, albeit the liquid compositions of this invention can be supplied without photoinitiator which is added by the user prior to use. These photoinitiators are themselves well known and in common use. They are usually ketonic, and frequently aromatic, such as benzophenone. Diethoxy acetophenone is a particularly effective photoinitiator. It will be appreciated that photoinitiators for the ultraviolet polymerization of (meth)acrylate functional compounds are well known and in common use, and the Example will use one which is currently available in commerce.

In the Examples which follow, all parts are by weight and all molecular weights are number average molecular weights with the unit of measure being daltons. It will be understood the ultraviolet-curable liquids which are used are simply illustrative and are presented merely because these liquids were the ones used in obtaining the results which are reported at the end of the Examples.

EXAMPLE 1

A liquid reservoir composition was prepared by simply mixing together 30 parts of a diacrylate of a diglycidyl ether of bisphenol A having a number average molecular weight of 500, 30 parts of the diacrylate of neopentyl glycol propoxylated with 2 propylene oxide units per molecule, 20 parts of trimethylol propane trimethacrylate, 10 parts of N-vinyl pyrrolidone, and 10 parts of the diester adduct of acrylic acid with polymethylene glycol having a number average molecular weight of 1600. This liquid composition was rendered sensitive to ultraviolet light by mixing in 4% by weight of the composition being sensitized of a benzylketal photointiator (hydroxycyclohexyl phenyl ketone — the Ciba-Geigy product Irgacure 184 may be used). The viscosity of this sample was 360 centipoises at room temperature (72° F.).

The above liquid reservoir composition was exposed to the previously described helium-cadmium laser focused to 350 micron diameter at various velocities using one, two, or more passes to determine the effects. The results are presented in Table I below.

TABLE I

| | Sample | | | | | | |
|---|---|---|---|---|---|---|---|
| | A | B | C | D | E | F | G |
| Scan Speed (sec/cm) | 0.16 | 0.21 | 0.32 | 0.47 | 0.16 | 0.21 | 0.16 |
| Dosage per Scan (milliJ/cm$^2$) | 45 | 60 | 90 | 135 | 45 | 60 | 45 |
| Scans per Layer | 1 | 1 | 1 | 1 | 2 | 2 | 3 |
| Dosage per Layer (milliJ/cm$^2$) | 40 | 60 | 90 | 135 | 90 | 120 | 135 |
| Specimen Thickness (mils) | 13.2 | 14.5 | 15.5 | 18.5 | 16.5 | 18.0 | 20.8 |
| % MEK Extractables | 54 | 45 | 34 | 24 | 20 | 18 | 15 |
| Tensile Strength (psi) | — | — | 600 | 1300 | 1600 | — | 2400 |
| Modulus (psi) | — | — | 9000 | 24000 | 36000 | — | 65000 |
| Distortion Factor | — | — | 1.6 | — | 1.3 | — | — |

It can be seen from comparison of samples C and E that an equal total dose when applied in short repeated scans results in lower methyl ethyl ketone (MEK) extractables, improved physical strength, and a 50% reduction in the measured distortion of the previously described cantilevered rectangle. The same applies to samples D and G with respect to methyl ethyl ketone extractables and physical properties. Comparison of samples D, E and F show reduced methyl ethyl ketone extractables in multiscanned systems even though the total applied dosage is less than in the single scanned sample.

Of possible overriding importance is the distortion factor which was described previously and which is the ratio of the top of a thin cantilevered rectangle to the bottom of that same rectangle. Using the 0.315 sec/cm single exposure described previously, the distortion factor was 1.6 which indicates the top of the rectangle was 60% longer than its bottom. Using two 0.1575 sec/cm scans (for the same total of 0.315 sec/cm), the distortion factor was improved from the previous 1.6 to 1.3. More particularly, the top of the rectangle was now only 30% longer than its bottom, instead of being 60% longer. This provides a 50% reduction in the measured distortion using the same total exposure dosage.

EXAMPLE 2

In a second example to show the effectiveness of short repeated scans in reducing the distortion factor, a liquid reservoir composition was prepared by simply mixing together 30 parts of a diacrylate ester of an ethoxylated bisphenol A having a number average molecular weight of 424, 20 parts of the diacrylate ester of a polymethylene glycol having a number average molecular weight of 1600, 25 parts of the diacrylate of neopentyl glycol propoxylated with two propylene oxide units per molecule, and 25 parts of N-vinyl pyrrolidone. This liquid composition was also rendered sensitive to ultraviolet light by mixing in 4% by weight of Irgacure 184 from Ciba-Geigy. The viscosity of this sample was 150centipoises at room temperature (72° F.).

The above liquid reservoir composition was exposed to the previously described helium-cadmium laser focused to 350 micron diameter at various velocity using one, two, or more scans to produce the cantilevered rectangle as previously described for the measurement of distortion factors. The results are presented in Table II below.

TABLE II

|  | Test Samples | | | |
| --- | --- | --- | --- | --- |
|  | H | I | J | K |
| Scan Speed (sec/cm) | 0.420 | 0.210 | 0.105 | 0.052 |
| Dosage per Scan (milliJ/cm$^2$) | 120 | 60 | 30 | 15 |
| Scans per layer | 1 | 2 | 4 | 8 |
| Dosage per Layer (milliJ/cm$^2$) | 120 | 120 | 120 | 121 |
| Cantilever Distortion Factor | 1.90 | 1.55 | 1.35 | 1.30 |
| Reduction in Distortion % | — | 39 | 61 | 67 |

After the photoformed object is removed from the liquid reservoir, the object is drained, sometimes rinsed, and then further cured, as desired, to increase its strength, but this is itself known.

To further illustrate the results obtainable in this invention, several different liquid reservoir compositions were formulated as follows:

| Component | Parts by Weight |
| --- | --- |
| Composition A (viscosity = 640 centipoises) | |
| Urethane acrylate (see Note 1) | 25 |
| Epoxy acrylate (see Ex. 1) | 25 |
| N-vinyl pyrrolidone | 20 |
| Trimethylol propane trimethacrylate | 15 |
| Neopentyl glycol propoxy diacrylate | 15 |
| Irgacure 184 photoinitiator | 4 |
| Methyl ether of hydroquinone | 0.01 |
| Composition B (viscosity = 440 centipoises) | |
| Epoxy acrylate (see Ex. 1) | 30 |
| Diester adduct of acrylic acid with polymethylene glycol (see Ex. 1) | 20 |
| Propoxylated diacrylate (see Ex. 1) | 25 |
| N-vinyl pyrrolidone | 25 |
| Irgacure 184 photoinitiator | 4 |
| Methyl ether of hydroquinone | 0.01 |
| Composition C (viscosity = 208 centipoises) | |
| Urethane acrylate (Note 2) | 25 |
| Epoxy acrylate (see Ex. 1) | 25 |
| Propoxylated diacrylate (see Ex. 1) | 25 |
| N-vinyl pyrrolidone | 25 |
| Irgacure 184 photoinitiator | 4 |
| Methyl ether of hydroquinone | 0.01 |

Note 1 - Hydroxy-terminated polyester of ethylene glycol and adipic acid (number average molecular weight of 1500) reacted with isophorone diisocyanate and then capped with hydroxyethyl acrylate.

Note 2 - The addition product of one mol of isophorone diisocyanate with one mole of 2-hydroxy ethyl acrylate and one mol of the caprolactone ester of 2-hydroxy ethyl acrylate.

As will be evident, composition B is more fluid and faster curing than composition A, and composition C is more fluid and faster curing than composition B. The viscosities are Brookfield Viscosities measured at 72° F.

The distortion factor of each composition was measured using a single scan and the expected result was obtained, namely, the more fluid and faster curing the composition, the greater the distortion factor. More particularly, the distortion factor for the three compositions was determined using a single scan, all being scanned at the same rate to provide the same dosage. The distortion factor for composition A was 1.47, for composition B it was 1.73, and for composition C it was 1.80.

Using the same total dosage and two scans, the distortion factor was at least halved for each composition. More particularly, the distortion factor for composition A was 1.23, for composition B it was 1.30, and for composition C it was 1.37. Also, in each instance the methyl ethyl ketone extractables were reduced (and the reduction was more than 50% for the slowest curing composition A).

The invention is defined in the claims which follow.
What is claimed is:

1. In a method for the formation of a thin walled three-dimensional object in a reservoir of liquid ultraviolet-curable ethylenically unsaturated material and in which a support is positioned immediately beneath the upper surface of the liquid reservoir with said upper surface being exposed to ultraviolet light in a pattern of line exposures to solidify the liquid at and near said upper surface in a series of cross-sections of the desired three-dimensional object, one atop the other, and thus form a series of superposed layers which adhere to one another to build said three-dimensional object within the liquid reservoir, the improvement comprising, stopping the line exposure at any portion of the surface in the formation of said series of superposed layers and then repeating the line exposure at least once again in the production of each said superposed layer so that the strength and solvent resistance of the formed object are increased and its distortion is minimized.

2. The improvement recited in claim 1 in which the ultraviolet exposure of each surface layer is carried out as a series of rapid repeated scans of a computerdirected focused laser.

3. The improvement recited in claim 1 in which said liquid ultraviolet-curable ethylenically unsaturated material comprises acrylate-functional material to speed the ultraviolet-initiated cure.

4. The improvement recited in claim 1 in which said liquid ultraviolet-curable ethylenically unsaturated material is a free flowing liquid to ease the burden of flowing said liquid over each solidified layer in preparation for the formation of the next layer.

5. In a method for the formation of a three-dimensional object in a reservoir of liquid ultraviolet-curable ethylenically unsaturated material and in which a support is positioned immediately beneath the upper surface of the liquid reservoir with said upper surface being exposed to light effective to polymerize said ehtylenically unsaturated material in a pattern of line exposures to solidify the liquid at and near said upper surface in a series of cross-sections of the desired three-dimensional object, one atop the other, and thus form a series of superposed layers which adhere to one another to build said three-dimensional object within the liquid reservoir, the improvement comprising, stopping the line exposure at any portion of the surface in the formation of said series of superposed layers and then repeating the line exposure at least once again in the production of each said superposed layer so that the strength and solvent resistance of the formed object are increased and its distortion is minimized.

6. The improvement recited in claim 5 in which the light exposure of each surface layer is carried out as a series of rapid repeated scans of a computer-directed focused laser.

* * * * *

UNITED STATES PATENT AND TRADEMARK OFFICE
CERTIFICATE OF CORRECTION

PATENT NO. : 4,945,032

DATED : July 31, 1990

INVENTOR(S) : Edward J. Murphy, Robert E. Ansel and John J. Krajewski

It is certified that error appears in the above-identified patent and that said Letters Patent is hereby corrected as shown below:

Col. 7, line 25, insert a space between "150" and "centipoises"
Col. 8, line 6, "(Note 2)" should be --(see Note 2)--
Col. 8, line 61, "computerdirected" should be --computer-directed--
Col. 10, line 2, after "stopping" delete "the" and insert --said--
Col. 10, line 3, before "exposure" insert --of light--

Signed and Sealed this

Twenty-fifth Day of February, 1992

Attest:

HARRY F. MANBECK, JR.

Attesting Officer

Commissioner of Patents and Trademarks